US006331797B1

(12) United States Patent
Lambert

(10) Patent No.: US 6,331,797 B1
(45) Date of Patent: Dec. 18, 2001

(54) VOLTAGE TRANSLATOR CIRCUIT

(75) Inventor: Nicolaas Lambert, Waalre (NL)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/447,543

(22) Filed: Nov. 23, 1999

(51) Int. Cl.$^7$ .................................................. H03L 5/00
(52) U.S. Cl. ............................. 327/333; 326/68; 326/81
(58) Field of Search ............................. 327/51, 52, 55, 327/57, 333; 326/63, 80, 68, 81

(56) References Cited

U.S. PATENT DOCUMENTS

| 4,973,864 | * | 11/1990 | Nogami | 327/208 |
| 4,996,443 |   | 2/1991  | Tateno | 326/68 |
| 5,377,150 | * | 12/1994 | McClure | 327/51 |
| 5,473,268 |   | 12/1995 | Declercq et al. | 326/80 |
| 5,682,174 |   | 10/1997 | Chiu | 345/84 |
| 5,723,986 |   | 3/1998  | Nakashiro et al. | 326/81 |
| 5,874,840 | * | 2/1999  | Bonaccio | 327/55 |
| 6,002,290 | * | 12/1999 | Avery et al. | 327/333 |
| 6,011,421 | * | 1/2000  | Jung | 327/333 |

FOREIGN PATENT DOCUMENTS

| 0903722A2 | 3/1999 | (EP) | G09G/3/36 |
| 07168153A | 7/1995 | (JP) | G02F/1/133 |

OTHER PUBLICATIONS

Patent Abstracts of Japan, 02145018, "Level Shift Circuit", by Kurata Kalsumasa.
Patent Abstracts of Japan, 08079053, "Level Shift Circuit", Kawasaki Masayuki.
Patent Abstracts of Japan, 04269011, "Level Shift Circuit", Hashimoto Yoshiharu.
Patent Abstracts of Japan, 04253417, "Level Shift Circuit", Horii Hideaki.
Patent Abstracts of Japan, 05249924, "Liquid Crystal Display Driving Circuit", Ogawa Fumihiro.

* cited by examiner

*Primary Examiner*—Terry D. Cunningham
*Assistant Examiner*—Quan Tra

(57) ABSTRACT

A method and apparatus for translating a voltage control signal to switch a drive output, having a circuit with a pair of branches, each branch having a pull down device, respective branches receiving complementary components of the voltage control signal; a pull up device, in series with a respective pull down device, and each being driven by a positive feedback signal reflecting a state of conduction of the pull up device; and a current blocking device, in series with the pull up device, having a control input for impeding a current flowing in series to a respective pull down device. One current blocking device is controlled to selectively block a current flow through one of the branches, while permitting current flow through the other branch. The state of the voltage control signal is switched, current flow through both branches is resumed. In a preferred embodiment, the complementary components of the voltage control signal are formed with an inverter. A transmission gate is provided, having a pair of complementary inputs from the nodes between the pull up devices and pull down device in series, to modulate the optical state of a liquid crystal light modulating structure. The pull down devices, pull up devices, current blocking devices, inverter and complementary device transmission gate are each preferably formed in a silicon integrated circuit, with the liquid crystal light modulating structure formed on the surface.

10 Claims, 5 Drawing Sheets

VOLTAGE TRANSLATOR CIRCUIT

FIELD OF THE INVENTION

The present invention relates to the field of voltage translator circuits, and more particularly to voltage translators within matrix drive integrated circuits.

BACKGROUND OF THE INVENTION

Voltage translators are typically employed to convert logic level drive control signals into output signals suitable for driving a load. Often, the output drive signal exceeds the voltage level of the logical control signal. In this case, the voltage translator acts as a voltage amplifier or isolator. A voltage translator for digital logical control signals should have low average and peak power dissipation, small cell size, fast load switching, and possibly with controlled output slew rate (to avoid generation of electromagnetic interference and switching transients).

A typical voltage translator circuit provides a four transistor cell having two pull down NMOS transistors, referenced to a common ground, which are complementarily driven by a logic control signal and an inverter, respectively, and two pull up PMOS transistors, referenced to a medium voltage, typically higher than the logic power supply reference voltage, which are "cross coupled" to provide positive feedback. A complementary output is produced at the respective nodes between the PMOS and NMOS transistors.

In alternate known designs, the PMOS transistor is replaced with a resistive structure, providing a continuous quiescent current draw during the full pulse period. Alternately, for heavy loads, the high and low side logic may be separately controlled. Such designs, however, are typically unsuitable for modern high density integrated circuits which contain many voltage translators which switch essentially in synchronism.

One of the known advantages of reflective active matrix projection display devices with liquid crystal on silicon is that the drivers can be integrated with the active matrix itself. This allows improved performance and reliability, with lowered total system cost.

In one type of design, an analog reference ramp digital-to-analog converter (D/A) scheme is used to convert digital logic-level incoming data signals 1 into analog column voltages on the panel. A global analog ramp 3 signal is generated every row period 7. Each column tracks the global analog ramp signal, until it reaches its intended gray scale. At that time, it is controlled to stop tracking, and holds its voltage till the end of the row period. The digital data for each respective individual column are converted into simultaneous, pulse width modulated signals. The pulse width modulated signals control the analog track-and-hold switches 4 between respective columns and the global analog ramp 3 signal. In this way the digital video data are converted into analog voltages on the columns. This arrangement is shown in FIG. 1.

As shown in FIG. 1, column data 1 is received by logic circuit 2, to control the modulation of the liquid crystal display (LCD) pixels 8. A global analog ramp 3 is generated in each row period 7, which is selectively latched by track and hold switches 4, based on an individual pulse width timing generated by the logic circuit 2. The latched analog ramp voltage on each column 5 is used to drive the corresponding liquid crystal display pixel of the selected row. At the end of each row period 7, an end of row select signal 6 resets the track and hold switches 4, preparing for driving the next row.

FIG. 2 shows a prior art voltage translator circuit system. A tracking signal 10 is received for each column, from the logic circuit 2. A buffer 16 and inverter 17 (or pair of inverters) buffer the signal and generate a complementary pair, for driving the voltage translator 12 itself. The voltage translator converts the standard logic 11 voltage levels to a medium voltage level, generated by the medium voltage power supply 14. The voltage translator 12 has two complementary branches, each having an NMOS transistor 18, 19, for active pull down, and a PMOS transistor 20, 21, for active pull up, in series. Each PMOS transistor 20, 21 is driven with positive feedback from the node between the NMOS and PMOS transistor of the complementary branch. These same nodes are used here to drive an analog transmission gate 13 including an NMOS transistor 22 and PMOS transistor 23, to control the track and hold of the global analog ramp signal 15, which drives each column. The logic to generate the pulse width modulated signals for each column is standard low voltage, e.g. 5V or less, but each track & hold switch has to handle the analog voltage range for the columns, which is generally larger than the standard logic voltage swing, e.g., 5V peak or more power supply voltage, typically 12 V min. A voltage translator circuit is provided for each column to convert the logical control signal into the potentially higher voltage drive signal. The voltage translator circuit therefore translates a complementary signal pair at standard logic voltages into a medium voltage signal pair. A known voltage translator circuit is shown in FIG. 2. Such a voltage translator circuit is disclosed in U.S. Pat. No. 5,723,986 and U.S. Pat. No. 5,682,174, expressly incorporated herein by reference, and JP 07-168,153 (Apr, 7, 1995). See, also U.S. Pat. No. 5,473,268, expressly incorporated herein by reference.

The track and hold switch is shown as a transmission gate 13 in FIG. 2, but other implementations are also possible. The known voltage translator 12 shown in FIG. 2 uses internal positive feedback to switch. Whenever the complementary inputs switch, one branch is temporarily floating (both the bottom NMOS transistor and the top PMOS transistor are "Off"), while the other branch draws heavy current (both NMOS and PMOS transistor are "On"). When the active NMOS transistor pulls the gate of the passive PMOS over the threshold voltage, it starts conducting and positive feedback occurs to complete the switch event. The gate of each NMOS transistor (18,19) is driven with logic voltage levels, and yet has to compete with the PMOS transistor that has essentially the full medium voltage power supply 14 voltage swing on its gate. Therefore, the NMOS transistors have to be substantially larger than the PMOS transistors (20,21), in order to pull the junction node voltage to a low enough level to turn the PMOS transistor in the other branch "On".

SUMMARY OF THE INVENTION

The present invention provides an improved voltage translator circuit which includes an additional pair of PMOS transistors interposed between the "cross coupled" pull up PMOS transistors and the output drive power supply (medium voltage). The drive voltage for these additional PMOS transistors is generated globally for an array of voltage translators, and is referenced to the output drive power supply (medium voltage).

By adding additional controls to the voltage translators of the known four transistor voltage translator design, performance can be improved. The additional controls are used to prepare the translator for an imminent switching event. This is possible because the switching events are sufficiently predictable within a row period. Thus, a switching transient is suppressed by blocking the current through the NMOS transistor immediately prior to the switching event, by turning "Off" the additional PMOS transistor. Since the circuit is complementary controlled, it is not necessary to provide active control to both branches of the circuit. Thus, the additional PMOS transistor in the non-actively controlled branch of the circuit can be held in a partially conducting condition continuously, in order to limit current flow during switching. The additional series PMOS transistors also allow the switching performance to be improved. FIG. 3 shows the arrangement according to the present invention.

In operation, the voltage translator circuit according to the present invention prepares for the switching event by turning "Off" the series PMOS transistor in the branch that would otherwise be drawing heavy current. The series PMOS transistor in the complementary branch should be turned "On" at this time, to provide appropriate positive feedback for switching.

The result is not only a reduced current spike on the power supply, but also reduced overall current consumption, because the current in the first branch is blocked. Switching performance is improved, because the NMOS transistor in the first branch no longer has to compete with the PMOS transistor in the same branch. This means that the NMOS transistor size can be substantially reduced, while maintaining improved switching performance. Therefore, the total circuit area can be even smaller than the known circuit. The improved switching performance also tends to improve the balance between the complementary outputs. This is important when driving transmission gates and/or other charge compensating track and hold switches.

While additional control signals are required for each voltage translator cell, therefore increasing drive circuit "overhead", in a display application, the additional overhead can be very low, because the column switches are modulated in a known sequence. For example, in the above-described analog reference D/A scheme shown in FIG. 1, all columns start tracking at the same time. Each column driver circuit stops tracking at a time that corresponds to the individual gray scale for that column. Therefore the extra control inputs for all columns can be driven in parallel from a pair of global signals. The active control inputs 30 for the switched branch go high just before the columns start tracking and low afterwards. The static control inputs 33 are DC driven such that the PMOS transistor acts as a permanent current limiter. The net result is that at the start of tracking, the actively controlled PMOS transistor is turned "Off", and the transition is rather slow because of the current limiting of the passive controlled PMOS transistor. This slowed response, however, doesn't affect sampling accuracy in this scheme, and in fact tends to limit the otherwise massive transient which occurs when all columns suddenly settle to the current analog ramp voltage.

It is noted that the 2V reference voltage driving the gate of the passively controlled PMOS transistor is but one option. This PMOS transistor may also be controlled, for example, by a global current mirror, a global active control signal, or intrinsically by providing the PMOS device with a very small width to length ratio with the gate tied to the substrate. It is therefore understood that this PMOS device serves primarily as a current limiter, which should be operative as such especially during transitions, and may remain in this condition throughout the operation cycle. FIG. 6 shows an implementation where the current limiting function of the passively controlled transistor is created by designing the active PMOS transistor of that branch with a small width to length ratio. FIG. 7 shows that the current limiting function can also be obtained with the extra PMOS devices in series between original PMOS devices and cross-coupled node.

After the start of tracking, the actively controlled PMOS transistor is turned "On" again, in preparation for the actual transition to the hold state of the column. The latter transition is critical for sampling accuracy, and in this case the weak conduction of the passively controlled PMOS transistor and the good conduction of the actively controlled PMOS transistor help in making the switch very fast.

Alternate schemes are also possible. In displays with a traditional-type shift register oriented column control, the inputs to the additional series PMOS transistors may be derived from the translator of the previous column circuit in the shift chain, as shown in FIG. 5.

Alternately, the control signals for the additional series PMOS transistors can be generated locally as a phase delayed signal of the output of their respective branches. Such a phase delay, for example, could be generated by series resistors and possibly additional parallel gate capacitors, as shown in FIG. 4.

It is noted that, while the present voltage translator circuit has been described with respect to standard complementary metal oxide silicon (CMOS) semiconductor processes, the same principles may also be applied to atypical processes and atypical semiconductors. For example, gallium arsenide, silicon-germanium, silicon carbide, organic substrate, and other semiconductor materials may be employed. The semiconductor may be crystalline, amorphous, thin film, semiconductor on insulator or other known type. The invention may also be adapted for enhancement or depletion mode semiconductors. Therefore, it is apparent that the invention is not limited to the preferred embodiment.

These and other objects and features of the present invention will become more fully apparent from the following description and appended claims taken in conjunction with the accompanying drawings.

BRIEF DESCRIPTION OF THE DRAWINGS

For a better understanding of the invention, reference is made to the drawings, which are to be taken in conjunction with the detailed specification to follow.

DETAILED DESCRIPTION OF THE PREFERRED EMBODIMENTS

Figure 1:
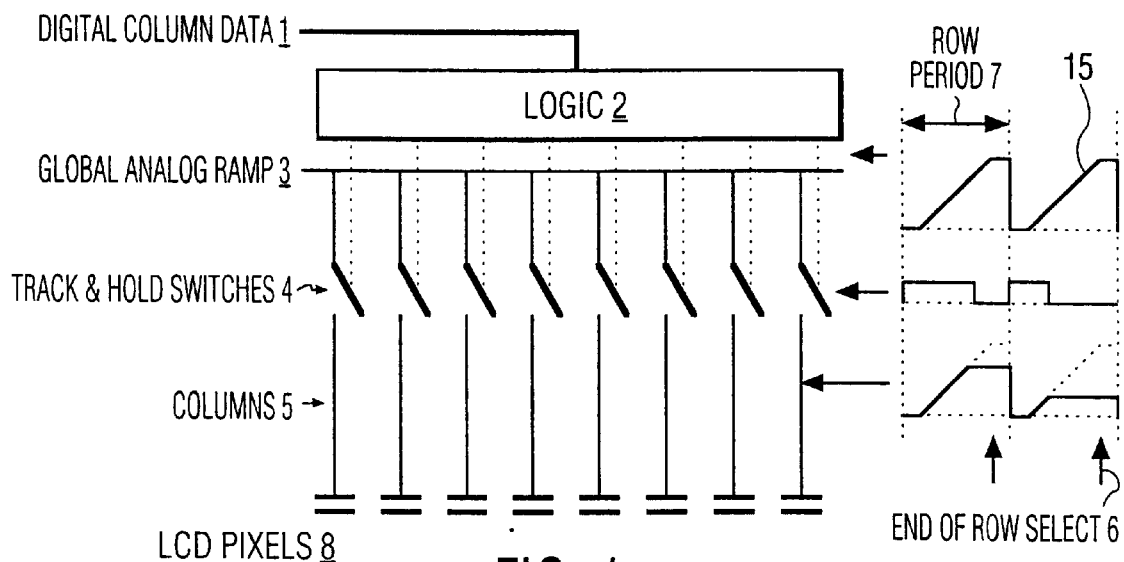
FIG. 1 shows a prior art pulse width modulation column drive circuit.
Figure 2:
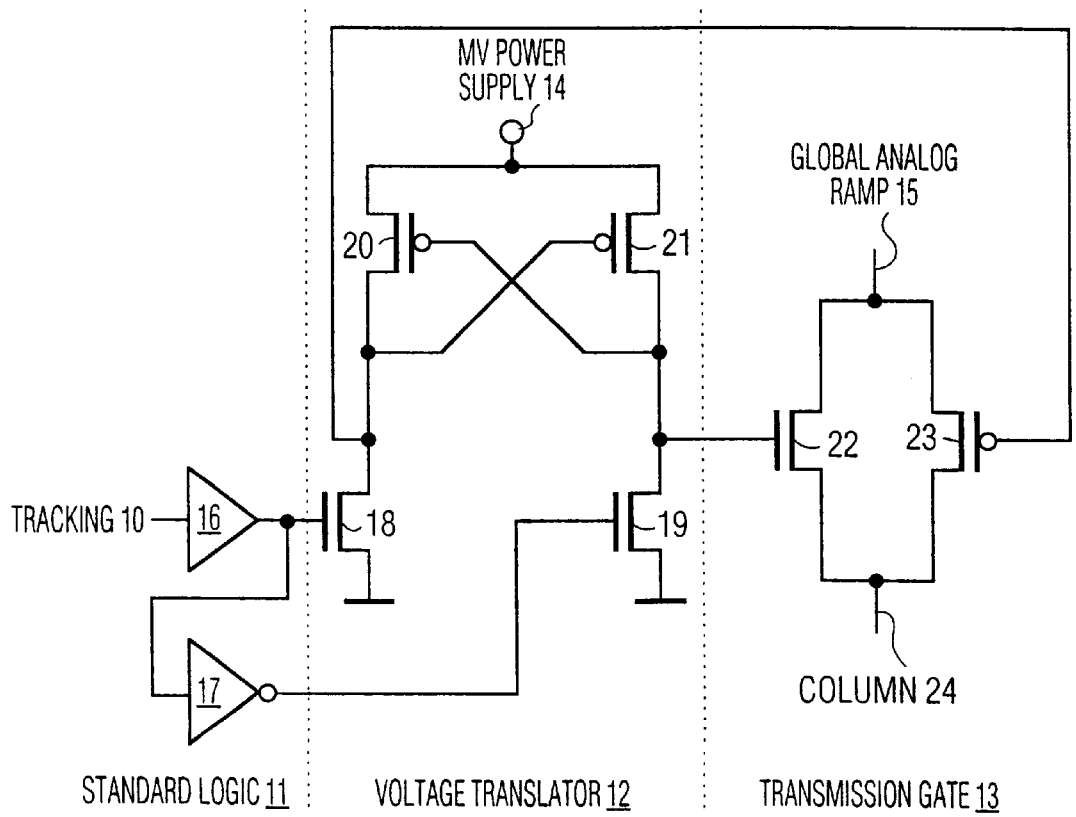
FIG. 2 shows a prior art voltage translator circuit.

The invention will now be described by way of the drawings, in which corresponding reference numerals indicate corresponding structures in the figures.

EXAMPLE 1

Figure 3:
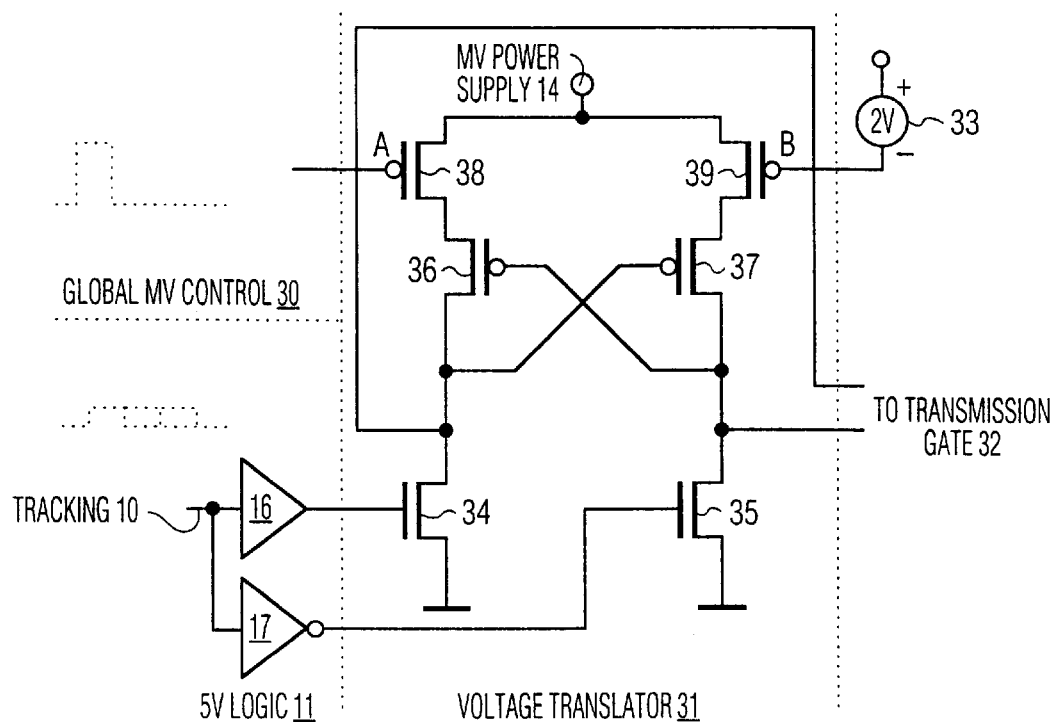
FIG. 3 shows first embodiment of a voltage translator circuit according to the present invention.

As embodied in the circuit shown in FIG. 3, the present invention provides an improved voltage translator circuit which includes an additional pair of PMOS transistors 38, 39 interposed between the "cross coupled" pull up PMOS transistors 36, 37 and the output drive power supply 14 (medium voltage). These additional PMOS transistors 38, 39 act as blocking devices, limiting the current flow, thereby allowing the NMOS transistors 34, 35 to switch under reduced load, and are especially useful for reducing current flow-through transient during switching. The drive voltage for these additional PMOS transistors 38, 39 is generated globally for an array of voltage translators, and is referenced to the output drive power supply 14 (medium voltage).

Immediately prior to the switching event, the additional PMOS transistor 38 is turned "Off". Since the circuit is complementarily controlled, it is not necessary to provide active control to both branches of the circuit. Thus, the additional PMOS transistor 39 in the non-actively controlled branch of the circuit can be held in a partially conducting condition continuously, in order to limit current flow during switching. For example, the gate is held 2V below the medium voltage power supply 14 voltage to maintain a partial state of conduction. The additional series PMOS transistors 38, 39 also allow the switching performance to be improved.

In operation, the voltage translator circuit according to the present invention prepares for the switching event by turning "Off" the series PMOS transistor 38 in the branch that would otherwise be drawing heavy current. The series PMOS transistor 39 in the complementary branch should be turned "On" (or at least partially conducting) at this time, to provide appropriate positive feedback in the PMOS transistor 37 for switching.

In the column drive circuit shown in FIG. 1, tracking starts at the same time for all columns, and tracking stops at a time that corresponds to the individual gray scale for each column. Therefore, the extra control inputs for all columns can be driven in parallel from a pair of global signals. The active control inputs 30 to the additional PMOS transistor 38 for the switched branch go high just before the columns start tracking and low afterwards. The static control inputs 33 are DC driven such that the PMOS transistor 39 acts as a permanent current limiter. The net result is that at the start of tracking, the active controlled PMOS transistor 38 is turned "Off", and the transition is acceptably slow because of the current limiting of the passive controlled PMOS transistor 39. After the start of tracking, the actively controlled PMOS transistor 38 is turned "on" again, in preparation for the actual transition to the hold state of the column 24. The latter transition is critical for sampling accuracy, and in this case the weak conduction of the passive controlled PMOS transistor 39 and the good conduction of the active controlled PMOS transistor 38 help in making the switch very fast.

EXAMPLE 2

Figure 4:
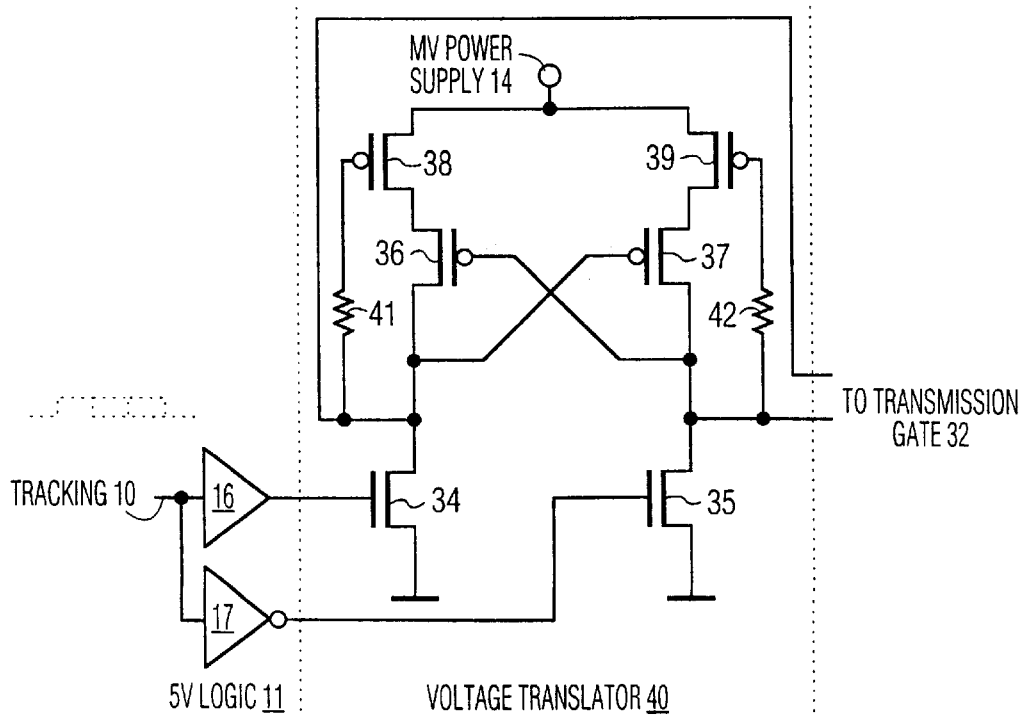
FIG. 4 shows a second embodiment of a voltage translator circuit according to the present invention.

The additional PMOS transistors 38, 39 need not be driven according to the scheme described in Example 1. Alternate schemes are also possible. The control signals for the additional series PMOS transistors 38, 39 can be generated locally as a phase delayed signal of the output of their respective branches. Such a phase delay, for example, could be generated by series resistors 41, 42 and possibly additional parallel gate capacitors (not shown), as represented in FIG. 4. These series resistors require a relatively large RC time constant, and therefore require a high resistance, e.g., tens to hundreds of kilohms, and/or additional capacitive structures, which may be provided in a known manner.

EXAMPLE 3

Figure 5:
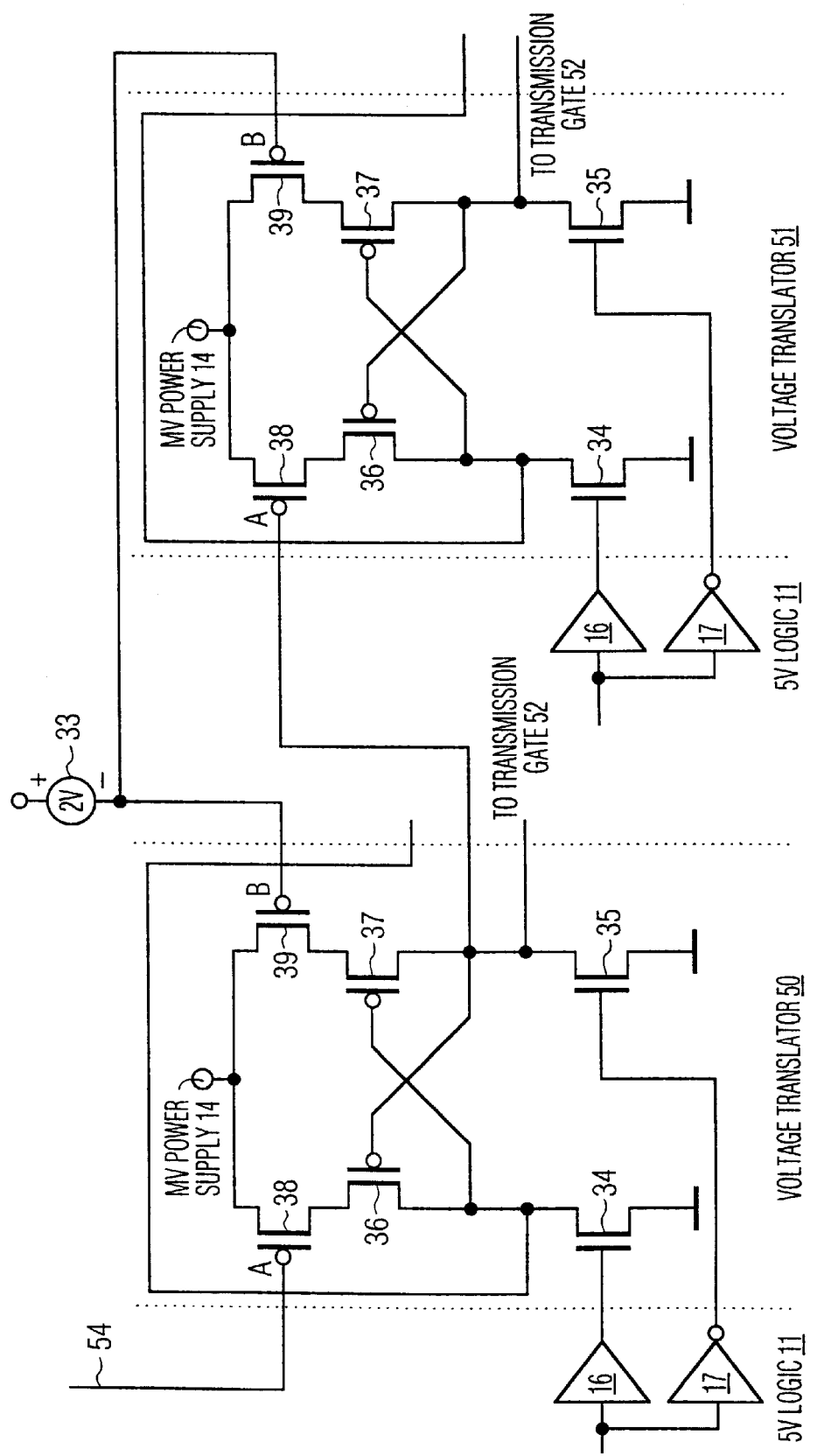
FIG. 5 shows a voltage translator according to the present invention receiving control signals from an adjacent column.

Alternately, in displays with a traditional-type shift register oriented column control, the inputs to the additional series PMOS transistor 38 of a voltage translator circuit 51 may be derived from the voltage translator 50 of the previous column 24 circuit in the shift chain, as shown in FIG. 5. Depending on the dimensioning of the circuit, it may be necessary to add an extra RC phase shift, or drive the circuit with a wider pulse of two or more "1's" in the shift register. In FIG. 5, one of the additional PMOS transistors 39 is passively switched, as in Example 1.

Figure 6:
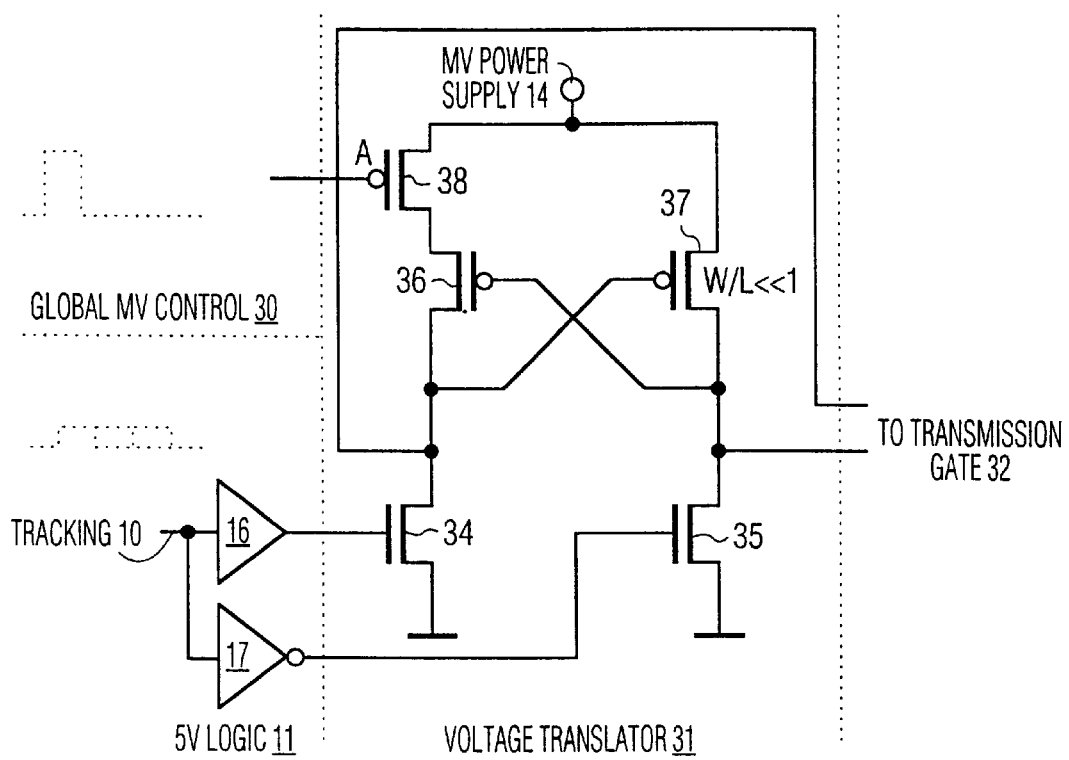
FIG. 6 shows another embodiment of a voltage translator of the present invention in which the active PMOS transistor has a small width-to-length ratio.

FIG. 6 shows an implementation where the current limiting function of the passively controlled transistor is created by designing the active PMOS transistor 37 of that branch with a small width-to-length ratio $W/L \ll 1$.

Figure 7:
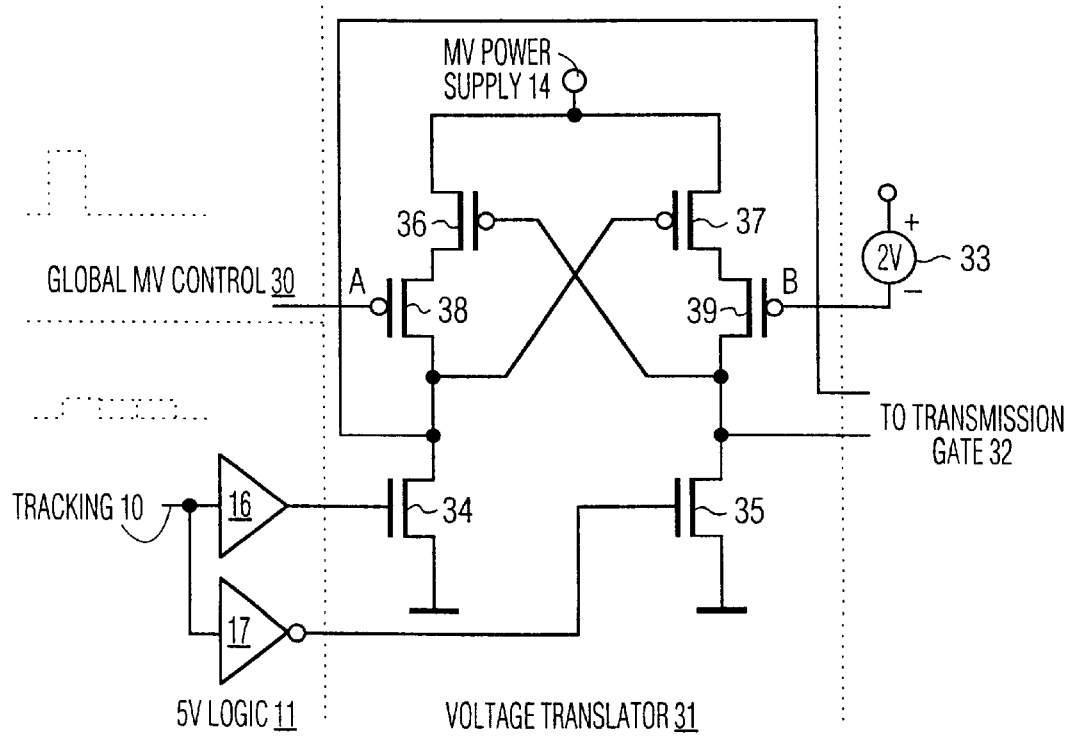
FIG. 7 shows yet another embodiment of a voltage translator of the present invention in which the extra PMOS devices are in series.

FIG. 7 shows an implementation in which the current limiting function is obtained with the extra PMOS devices 36, 37 in series between the original PMOS devices 35 and 34, respectively, and the cross-coupled node.

Figure 8:
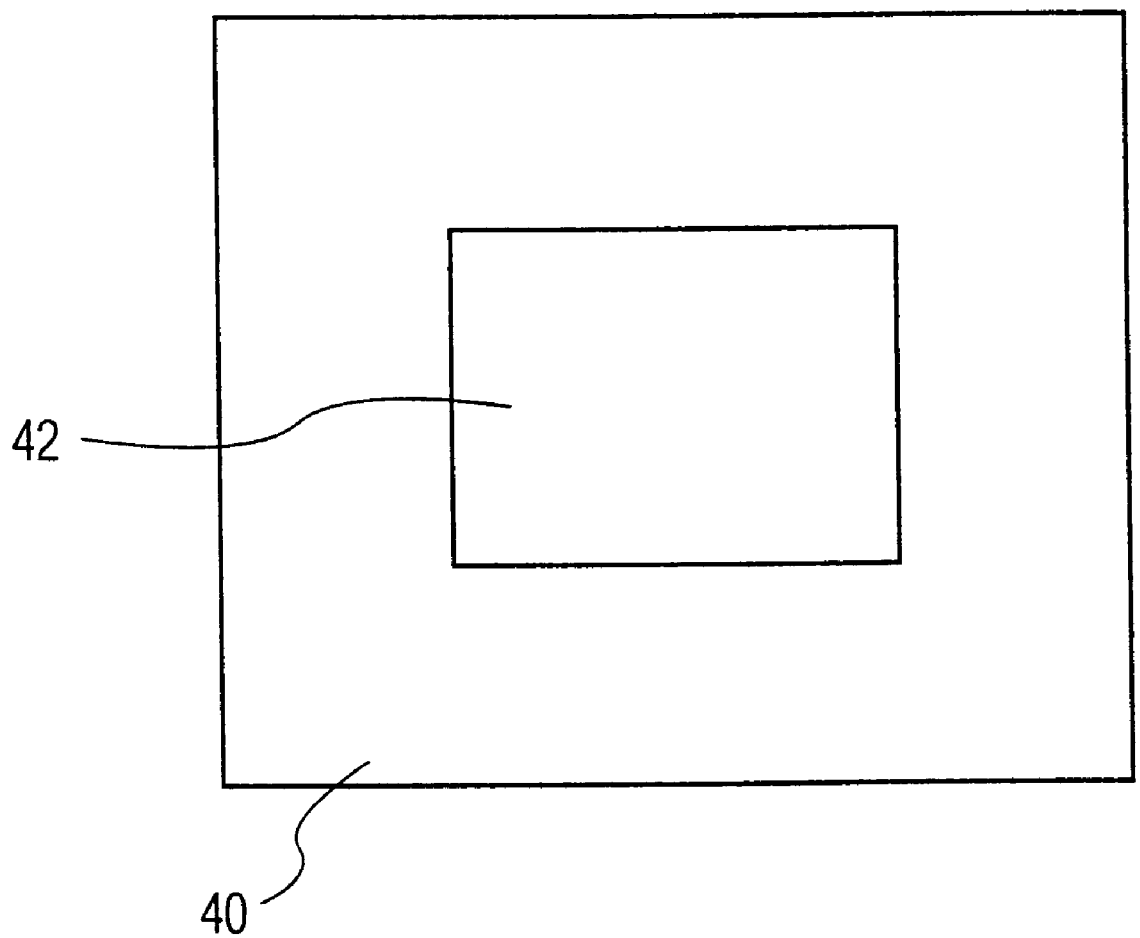
FIG. 8 shows a liquid crystal display (LCD) device mounted on an integrated circuit chip.

FIG. 8 shows a liquid crystal display (LCD) device 42 mounted on an integrated circuit chip 40.

While the above detailed description has shown, described and pointed out the fundamental novel features of the invention as applied to various embodiments, it will be understood that various omissions and substitutions and changes in the form and details of the system and method illustrated may be made by those skilled in the art, without departing from the spirit of the invention. Consequently, the full scope of the invention should be ascertained by the appended claims.

What is claimed is:

1. A voltage translator circuit for employing a control signal referenced to a first reference voltage to switch a drive output referenced to a second reference voltage, comprising:

(a) a pair of pull down devices, receiving a control signal as a respective one of a pair of complementary signals;

(b) a pair of pull up devices, each in series with a respective one of the pair of pull down devices, and each being driven by a respective positive feedback signal reflecting a state of conduction of the respective pull up device; and (c) current blocking devices, in series with a respective one of the pair of pull up devices, at least one of which having a control input for selectively impeding a current flowing in series to a respective pull down device, wherein one of the pair of current blocking devices has a static control input limiting a current flow therethrough and the other of the pair of current blocking devices has an active control input for selectively modulating a flow therethrough in dependence thereon.

2. A voltage translator circuit for employing a control signal referenced to a first reference voltage to switch a drive output referenced to a second reference voltage, comprising:

(a) a pair of pull down devices, receiving a control signal as a respective one of a pair of complementary signals;

(b) a pair of pull up devices, each in series with a respective one of the pair of pull down devices, and each being driven by a respective positive feedback signal reflecting a state of conduction of the respective pull up device; and (c) current blocking devices, in series with a respective one of the pair of pull up devices, at least one of which having a control input for selectively impeding a current flowing in series to a respective pull down device, wherein each of said pair of current blocking devices has a control input signal referenced to said second voltage reference.

3. A method of translating a voltage control signal referenced to a first voltage reference to switch a drive output referenced to a second reference voltage, comprising the steps of:

(a) providing a circuit having a pair of branches, each branch having:
   (i) a pull down device, respective branches receiving complementary components of the voltage control signal;
   (ii) a pull up device, in series with a respective pull down device, and each being driven by a positive feedback signal reflecting a state of conduction of the pull up device; and
   (iii) a current blocking device, in series with the pull up device, having a control input for impeding a current flowing in series to a respective pull down device;

(b) selectively blocking a current flow through one of the branches by operating the control input of one of the current blocking devices while permitting current flow through the other branch;

(c) while current flow is selectively blocked in one of the branches, switching a state of the voltage control signal; and (d) after switching a state of the voltage control signal, selectively permitting current flow through both branches.

4. The method according to claim 3, wherein the second reference voltage is greater than the first reference voltage.

5. The method according to claim 3, wherein the pull down devices are each NMOS transistors and the pull up devices are each PMOS transistors, the current blocking devices are each PMOS transistors, and the positive feedback signal for a respective pull up device is the node voltage at a junction between the other pull up device and the pull down device in series with it.

6. The method according to claim 3, further comprising the step of receiving an input signal and inverting the input signal to form the complementary components of the voltage control signal.

7. The method according to claim 3, further comprising the step of controlling one of the current blocking devices to achieve a state of partial conduction.

8. The method according to claim 3, further comprising the step of driving a complementary device transmission gate with a pair of complementary outputs from the respective nodes in each branch between the pull up device and the pull down device.

9. The method according to claim 3, further comprising the step of modulating an optical state of a liquid crystal display device based on the voltage control signal.

10. The method according to claim 3, further comprising the steps of:

receiving an input signal and inverting the input signal with an inverter to form the complementary components of the voltage control signal;

providing a complementary device transmission gate, wherein a pair of complementary outputs from the nodes between a pull up device and pull down device of a respective branch drive control inputs of the complementary device transmission gate;

providing a liquid crystal display devicedisposed on a surface of the silicon integrated circuit; and modulating an optical state of the liquid crystal display device with the complementary device transmission gate, wherein the pull down devices, pull up devices, current blocking devices, inverter and complementary device transmission gate are each formed in a silicon integrated circuit.

* * * * *